(12) United States Patent
Kobayashi et al.

(10) Patent No.: US 7,776,693 B2
(45) Date of Patent: Aug. 17, 2010

(54) METHOD OF MANUFACTURING SEMICONDUCTOR APPARATUS

(75) Inventors: Kenya Kobayashi, Kanagawa (JP);
Hideo Yamamoto, Kanagawa (JP);
Atsushi Kaneko, Kanagawa (JP);
Yoshimitsu Murase, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 274 days.

(21) Appl. No.: 11/905,078

(22) Filed: Sep. 27, 2007

(65) Prior Publication Data

US 2008/0081422 A1    Apr. 3, 2008

(30) Foreign Application Priority Data

Sep. 28, 2006   (JP)  .............................. 2006-264480

(51) Int. Cl.
*H01L 21/336* (2006.01)
(52) U.S. Cl. ................ 438/270; 257/330; 257/E21.429
(58) Field of Classification Search ................ 438/270; 257/330, E21.429
See application file for complete search history.

(56) References Cited

U.S. PATENT DOCUMENTS

| 4,767,722 | A | 8/1988 | Blanchard |
| 6,472,678 | B1 | 10/2002 | Hshieh et al. |
| 2002/0009854 | A1* | 1/2002 | Hshieh et al. ................ 438/270 |
| 2002/0009867 | A1* | 1/2002 | Numazawa et al. ......... 438/589 |
| 2002/0130359 | A1* | 9/2002 | Okumura et al. ............ 257/330 |
| 2003/0205758 | A1* | 11/2003 | Zeng .......................... 257/341 |
| 2005/0167748 | A1* | 8/2005 | Onda et al. .................. 257/341 |

FOREIGN PATENT DOCUMENTS

| CN | 1436371 A | 8/2003 |
| JP | 2000-252468 | 9/2000 |
| JP | 2003-101027 | 4/2003 |
| JP | 2005-191359 | 7/2005 |
| WO | WO 01/99177 A2 | 12/2001 |
| WO | WO 03/046999 | 6/2003 |

OTHER PUBLICATIONS

Chinese Office Action date Jan. 8, 2010, with English translation.

* cited by examiner

*Primary Examiner*—Steven J Fulk
(74) *Attorney, Agent, or Firm*—McGinn IP Law Group, PLLC

(57) ABSTRACT

A method of manufacturing a semiconductor apparatus includes forming a trench in a semiconductor layer, forming a gate electrode inside the trench, forming a thermally-oxidized film on the gate electrode inside the trench, forming a silicate glass film on the thermally-oxidized film inside the trench, forming a body region inside the semiconductor layer, and forming a source region on the body region. The method provides a semiconductor apparatus having reduced fluctuation of a channel length and low ON-resistance.

8 Claims, 6 Drawing Sheets

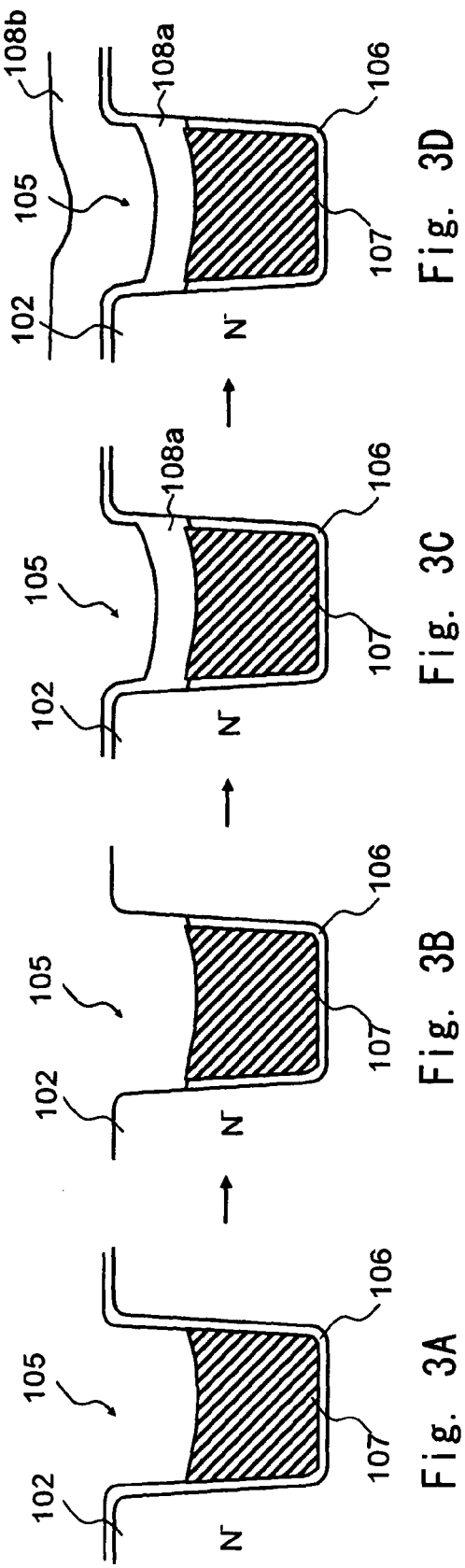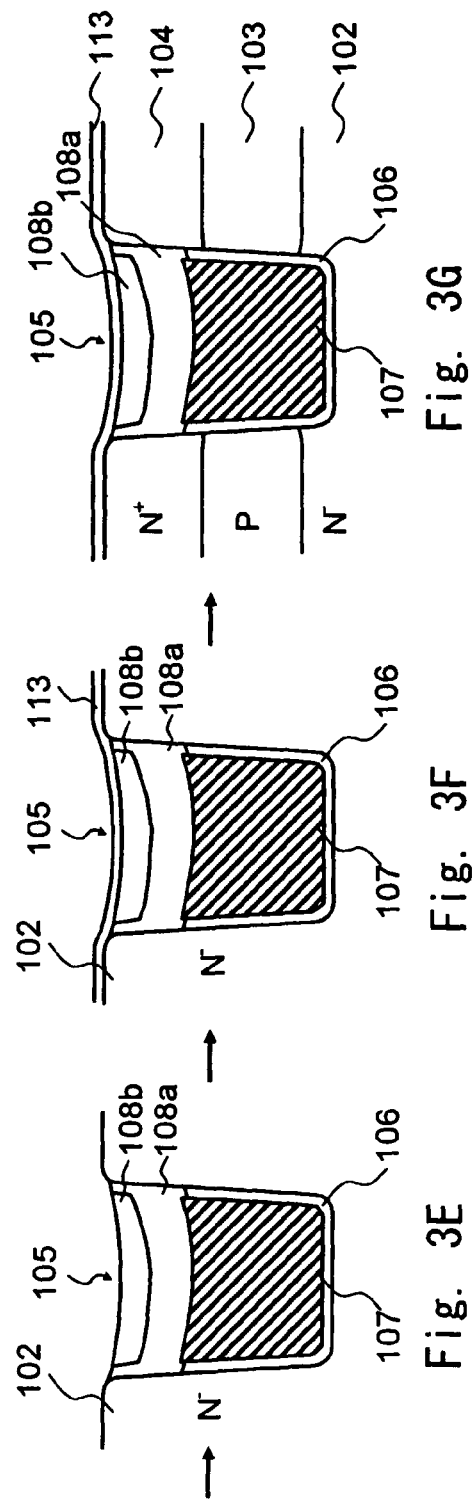

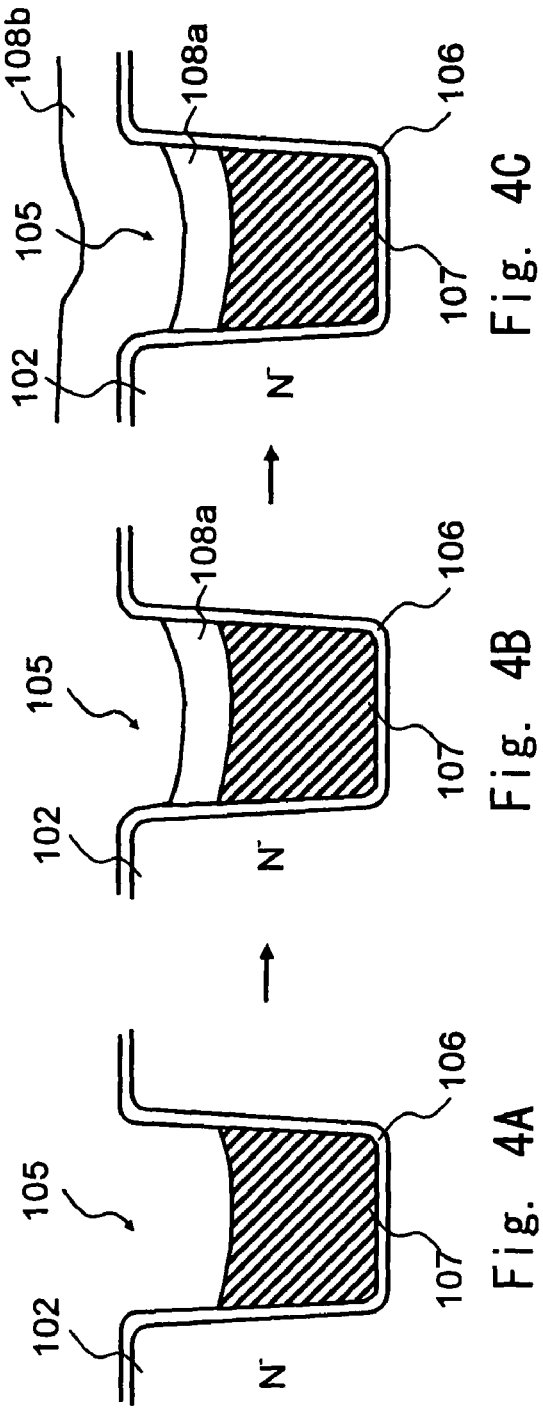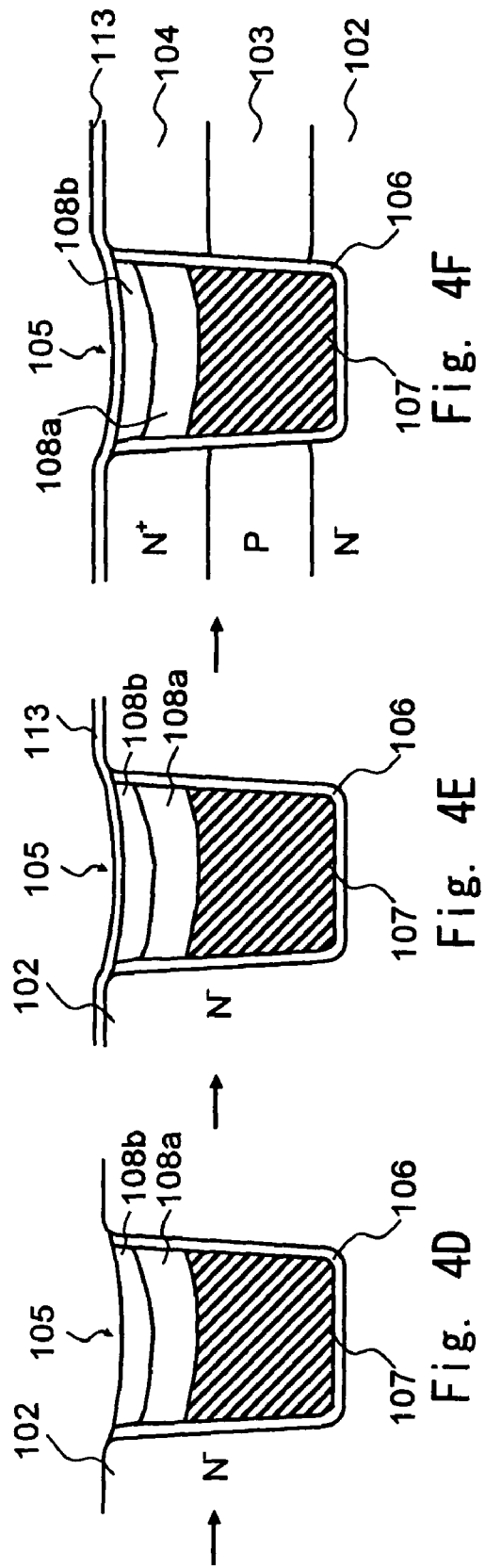

METHOD OF MANUFACTURING SEMICONDUCTOR APPARATUS

BACKGROUND OF THE INVENTION

1. Field of the Invention

The present invention relates to a method of manufacturing a semiconductor apparatus and, specifically, to a method of manufacturing a semiconductor apparatus having a vertical MOSFET (metal oxide semiconductor field effect transistor).

2. Description of Related Art

A vertical MOSFET (metal oxide semiconductor field effect transistor) is normally used as a power MOSFET for switching power to supply high voltage or large current. In the vertical MOSFET, a source electrode is formed on one surface of a semiconductor substrate, and a drain electrode is formed on the other surface of the semiconductor substrate. Therefore, the current flows in the vertical direction of the semiconductor substrate. It is required that the power MOSFET has as small ON-resistance as possible to save power consumption.

Specifically, ON-resistance per area can be reduced by narrowing the distance between two adjacent gate electrode portions and increasing the number of channel regions per area. In a conventional vertical MOSFET as disclosed in U.S. Pat. No. 4,767,722, a body contact region passing through the source region is formed between two adjacent gate electrode portions. The two adjacent gate electrode portions mean two certain opposed portions of a gate electrode that are arranged in parallel each other. A plurality of gate electrode portions are connected to each other and form one lattice-shaped gate electrode as shown in FIG. 9 of U.S. Pat. No. 4,767,722. Thus, one source region, a body contact region, and the other source region are formed in order between two adjacent gate electrode portions. In order to narrow the distance between the two gate electrode portions, a contact hole for connecting the source electrode and the body region is formed between the two gate electrode portions as disclosed in International Patent Publication No. WO03/046999. However, there is a limit to narrow the distance between the two adjacent gate electrode portions.

On the other hand, a vertical MOSFET in which the distance between the two gate electrode portions is ultimately narrowed with no body contact region or no contact hole passing through the source region that is arranged between the two gate electrode portions is disclosed in Japanese Unexamined Patent Publications No. 2003-101027, No. 2000-252468, and No. 2005-191359 for example. FIG. 5 is a sectional view showing a semiconductor apparatus 1 which is a prototype similar to a conventional vertical P-channel MOSFET disclosed in Japanese Unexamined Patent Publication No. 2003-101027. FIG. 6 is a sectional view showing a semiconductor apparatus 1 which is a vertical N-channel MOSFET manufactured in the same way as the P-channel MOSFET in FIG. 5. The each semiconductor apparatus 1 has a drain region 2, a body region 3, a source region 4, a trench 5, a gate insulation film 6, a gate electrode portion 7, interlayer insulation film 8, a drain electrode 9, and a source electrode 10. As mentioned above, owing to no body contact region or no contact hole passing through the source region 4 between the two gate electrode portions 7, the distance between the two gate electrode portions 7 can be narrowed. Now, the drain region 2 of a vertical P-channel MOSFET generally has a two-layer structure of a $P^+$-type substrate and a $P^-$-type epitaxial layer. Also the drain region 2 of a vertical N-channel MOSFET generally has a two-layer structure of an $N^+$-type substrate and an $N^-$-type epitaxial layer. In FIGS. 5 and, however, the drain region 2 is simplified to one layer structure symbolized with "P" and "N" respectively.

ON-resistance can also be reduced by shortening a channel length. Specifically, a shallow body region, a so-called shallow junction, is effective. However, it is required not to decrease drain-source breakdown voltage.

In the manufacturing process of the vertical P-channel MOSFET illustrated in FIG. 5, the trench 5 is formed after forming the body region 3 and the source region 4. Then, each gate insulation film 6 is formed. Therefore, the shape of the body region 3 and the source region 4 changes near the interface between the gate insulation film 6 formed on the side wall of the trench 5 and the silicon substrate. Specifically, as illustrated in FIG. 5, the concentration of impurities such as boron in the P-type source region 4 decreases near the gate insulation film 6, which leads to the shallow P-type source region 4, since boron diffuses into the gate insulation film 6 during oxidation process. To the contrary, the concentration of impurities such as phosphorus and arsenic in the N-type body region 3 increases near the gate insulation film 6, which leads to the deep N-type body region 3, since impurities segregate near the gate insulation film 6. Therefore, the channel length becomes long and which leads to high ON-resistance. Furthermore, a large process margin is required since the channel length fluctuates so widely that it is difficult to control.

On the other hand, in the N-channel MOSFET shown in FIG. 6 which is manufactured in the same way as the P-channel MOSFET in FIG. 5, the channel length becomes short and which may unfavorably cause the breakdown voltage to decrease and the leak current to increase.

In the vertical MOSFET disclosed in Japanese Unexamined Patent Publication No. 2000-252468, the trench 5 is formed after forming the body region 3 only. Then, the gate insulation film 6 is formed. Also, in this case, even though the channel length is longer than the N-channel MOSFET of FIG. 6, it becomes short, which may unfavorably cause the breakdown voltage to decrease and the leak current to increase.

As mentioned above, in the vertical MOSFETs of the related art, the channel length fluctuates so widely that it is difficult to control. Therefore, it is difficult to reduce ON-resistance by a shallow junction in practice.

SUMMARY

According to an aspect of the present invention, there is provided a method of manufacturing a semiconductor apparatus that includes forming a trench on a semiconductor substrate, forming a gate electrode portion inside the trench, forming a thermally-oxidized film on the gate electrode portion, forming a silicate glass film on the thermally-oxidized film in an upper portion of the trench, forming a body region inside the semiconductor substrate, and forming a source region on the body region.

The present invention provides a method of manufacturing a semiconductor apparatus capable of reducing fluctuation of a channel length and having low ON-resistance.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 3A to 3G are sectional views showing a manufacturing method of a semiconductor apparatus according to the one embodiment of the present invention;

FIGS. 4A to 4F are sectional views showing another manufacturing method of a semiconductor apparatus according to the embodiment of the present invention;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the first embodiment, the present invention is applied to a semiconductor apparatus for high-current or low-resistance use in which a number of transistor cells are combined into one MOSFET. While a single transistor cell typically carries a current of about several 10 to several 100 μA, such a MOSFET can carry a current of about 1 to 200 A and is used for power supply in consumer-electronics products, driving of vehicle motors or the like.

Figure 1:
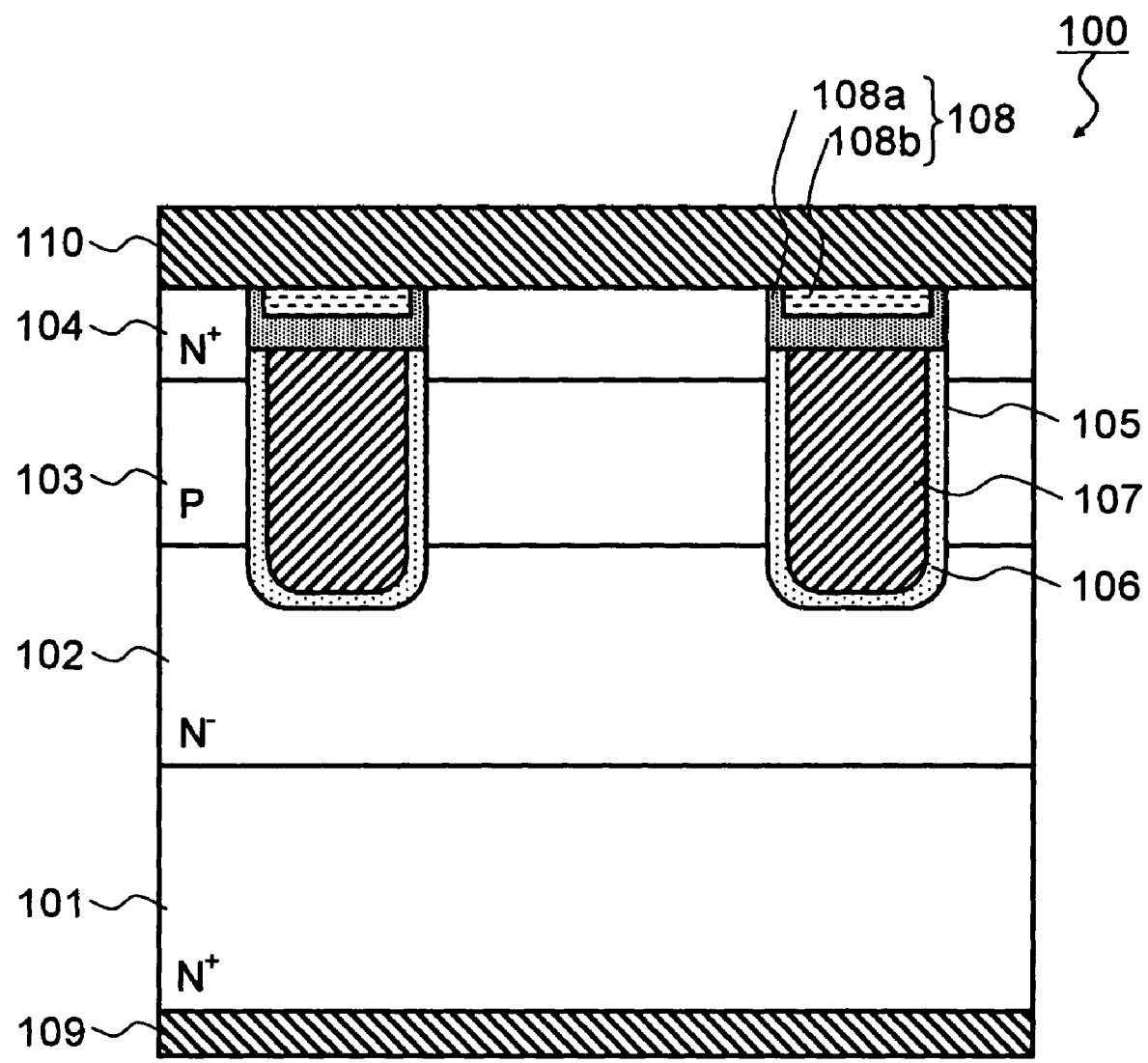
FIG. 1 is a sectional view showing a semiconductor apparatus of one embodiment of the present invention.
Figure 2:
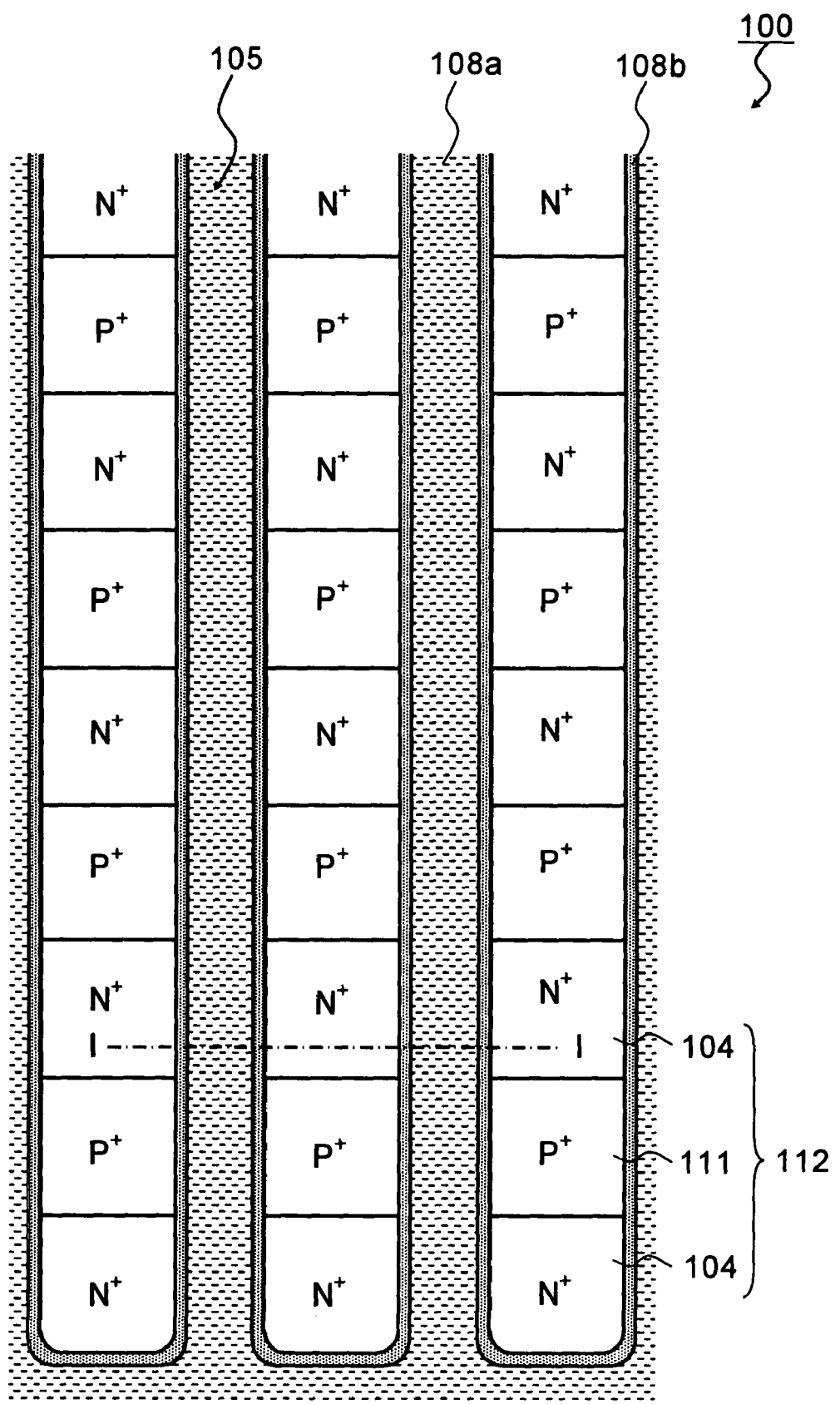
FIG. 2 is a plan view showing a semiconductor apparatus of the one embodiment of the present invention.
Figure 5:
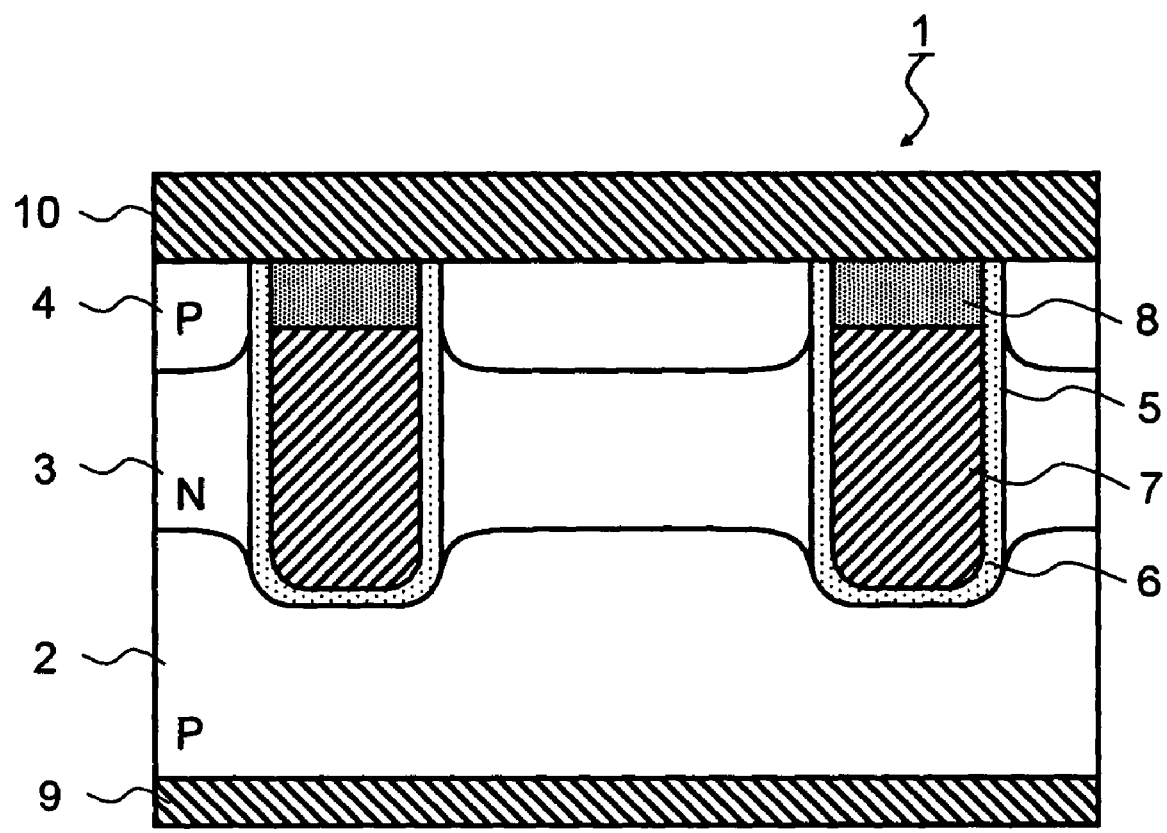
FIG. 5 is a sectional view showing a prototype semiconductor apparatus.
Figure 6:
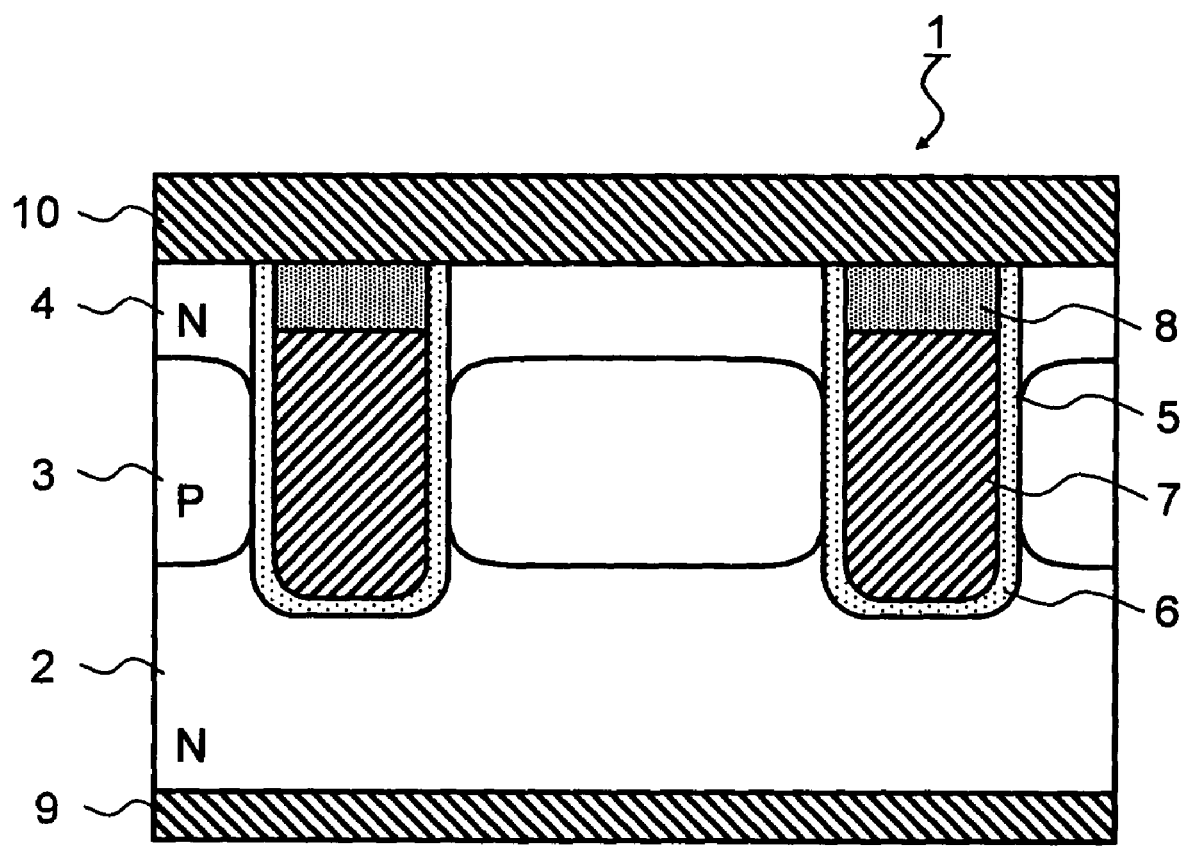
FIG. 6 is a sectional view showing another prototype semiconductor apparatus.

FIG. 1 is a sectional view showing a semiconductor apparatus 100 of an embodiment of the invention. FIG. 2 is a plan view showing a semiconductor apparatus 100, but a source electrode is omitted. FIG. 1 is a sectional view along line I-I of FIG. 2.

As shown in FIG. 1, the semiconductor apparatus 100 is a vertical N-channel MOSFET including an $N^+$-type semiconductor substrate 101, an epitaxial layer 102 of $N^-$-type (a first conductivity type), a body region 103 of P-type (a second conductivity type), a source region 104 of $N^+$-type (a first conductivity type), a trench 105, a gate insulation film 106, a gate electrode portion 107, an interlayer insulation film 108, a drain electrode 109, and a source electrode 110. As a matter of course, this embodiment can apply to a vertical P-channel MOSFET. In this embodiment, first and second conductivity types correspond to P-type and N-type, respectively. By the way, when it is simply referred to as the "semiconductor substrate" in this specification, it does not mean the $N^+$-type semiconductor substrate 101 but the whole semiconductor substrate.

A semiconductor substrate 101 shown in FIG. 1 is an $N^+$-type semiconductor substrate consisting of silicon, for example. An epitaxial layer 102 is formed on whole surface of the semiconductor substrate 101. The epitaxial layer 102 is an $N^-$-type semiconductor layer consisting of silicon, for example, which serves as a drain of the vertical MOSFET together with the semiconductor substrate 101.

A body region 103 is formed on the epitaxial layer 102. The body region 103 is a P-type semiconductor region containing boron, for example, where a channel is formed in the vicinity of a gate electrode portion 107 during operation of the vertical MOSFET.

A source region 104 is formed on a surface of the body region 103. The source region 104 is an $N^+$-type semiconductor region containing phosphorus or arsenic, for example, which serves as a source of the MOSFET.

A trench 105 that reaches a position deeper than the source region 104 and the body region 103 is formed above the semiconductor substrate 101. Inside the trench 105, a gate insulation film 106 is formed on the inner surface of the trench 105. Also formed inside the trench 105 is the gate electrode portion 107. The gate electrode portion 107 is formed of a polysilicon layer, for example.

On each gate electrode portion 107 formed in the trench 105, an interlayer insulation film 108 is formed to substantially fill the top portion of the trench 105. Ideally, it is preferred that the surface of the interlayer insulation film 108 and the surface of the source region 104 are integrated and the integrated surface is perfectly flat. However, as described in detail hereinafter, the interlayer insulation film 108 is formed by etching back to expose the surface of the source region 104 after covering the inside of the trench 105 and the surface of the source region 104 with an insulation film. Since it is required that the insulation film on the surface of the source region 104 is perfectly removed, the surface of the interlayer insulation film 108 formed in the trench 105 is more concave than the surface of the source region 104, in practice.

Further, an interlayer insulation film 108 comprises at least a thermally-oxidized film 108a of the gate electrode portion 107 consisting of a polysilicon layer and a silicate glass film 108b with an excellent gap-filling property. The silicate glass film 108b is preferably formed of silicate glass such as BPSG (Boron doped Phospho-Silicate Glass) or NSG (Non-doped Silicate Glass), for example. The interlayer insulation film 108 has the thermally-oxidized film 108a with higher breakdown voltage than the CVD (chemical vapor deposition)-oxidized film and the silicate glass film 108b with excellent gap-filling properties formed on the thermally-oxidized film 108a, and thus can be formed thinner while maintaining insulation properties. Therefore, the source region 104 can be formed more shallowly and which leads to reduce ON-resistance by a shallow junction. Compared with NSG, BPSG has better filling properties, while NSG has higher breakdown voltage. Therefore, when breakdown voltage is more important than filling properties, NSG may be chosen. To the contrary, when enough breakdown voltage is obtained by forming the thermally-oxidized film, BPSG may be chosen with a focus on filling properties.

Specifically, breakdown voltage of a thermally-oxidized film is about 8 MV/cm and breakdown voltage of an NSG film is about 4 MV/cm. However, these values may change with oxidation condition or growth condition. For example, the combination of an about 40 nm thermally-oxidized film and an about 80 nm NSG film can achieve about 64V breakdown voltage. The interlayer insulation film 108 may have three or more layers although it has a two-layer structure in FIG. 1. Specifically, both BPSG and NSG films may be formed on the thermally-oxidized film 108a. Further, the interlayer insulation film 108 may have an HTO (High Temperature Oxide) film which is a silicon oxide film formed by a high temperature CVD. However, as mentioned above, the interlayer insulation film 108 is desirable to be as thin as possible while maintaining insulation properties, for the sake of a shallow junction.

As shown in FIG. 1, under the $N^+$-type semiconductor substrate 101, the drain electrode 109 having a multilayer structure comprising at least one of Ti, Cr, Ni, Au, Ag and the like is formed. On the other hand, on the source region 104, the source electrode 110 comprising at least one of Al and Cu, for example, is formed through a barrier metal film comprising at least one of Ti, TiN, TiW and the like, for example. Now, the source electrode 110 is formed on the surface of the source region 104 and the interlayer insulation film 108.

Further, the distance between the two gate electrode portions 107 is ultimately narrowed with no body contact region or no contact hole for connecting the source electrode 110 to the body region 103 between the two gate electrode portions 107 in the same way as the vertical MOSFET disclosed in Japanese Unexamined Patent Publications No. 2003-101027, No. 2000-252468, and No. 2005-191359.

As shown in FIG. 2, in the longitudinal direction of each area surrounded by the trench 105, a $P^+$-type body contact region 111 is formed between the two $N^+$-type source regions 104. The source electrode 110 shown in FIG. 1 is formed on almost all the surface of the source regions 104, the body contact regions 111 and the interlayer insulation film 108 shown in FIG. 2 and connected to the body region 103 through the $P^+$-type body contact region 111. In this way, since the $N^+$-type source region 104 and the $P^+$-type body contact region 111 are arrayed in a row in the longitudinal direction of each area surrounded by the trench 105, the distance between the two gate electrode portions 107 can ultimately be narrowed. Now, a unit MOSFET 112 is corresponding to each area surrounded by the trench 105. Arrangement of the unit MOSFET 112 is not limited to FIG. 2.

A method of manufacturing a semiconductor apparatus having the above-described structure is described hereinafter with reference to FIGS. 3A to 3G. To begin with, processes to FIG. 3A are described.

First, the $N^-$-type semiconductor epitaxial layer 102 is epitaxially grown on the whole surface of the $N^+$-type semiconductor substrate 101. Now, the $N^+$-type semiconductor substrate 101 is omitted in FIGS. 3A to 3G. Then, an element isolating film (not shown) is formed by a local oxidation of silicon (LOCOS) process, for example.

After that, the epitaxial layer 102 is selectively removed by photolithography and reactive ion etching (RIE). The width of the opening of the trench 105 is typically from 0.25 to 0.5 μm, but may be more narrowed. The epitaxial layer 102 thereby has the trench 105 with a depth of approximately 1 μm to form a gate electrode in a lattice. Then, an oxide film (not shown) is formed inside the trench 105 at about from 1100 to 1200° C. and then removed, thereby rounding the bottom corner of the trench 105.

Then, the gate insulation film 106 of about from 30 to 80 nm thickness is formed on the surface of the epitaxial layer 102 according to desired MOSFET properties (gate-source breakdown voltage, threshold voltage, ON-resistance and so on). The gate insulation film 106 is formed by oxidizing the surface of the epitaxial layer 102 in atmosphere of an $H_2$—$O_2$, for example.

After that, a polysilicon layer is deposited on whole surface of the semiconductor substrate, or the epitaxial layer 102, by low-pressure CVD, for example. The polysilicon layer has a thickness such that the polysilicon fills the entire inside of the trench 105 and the surface of the polysilicon layer becomes nearly flat. Therefore, the surface of the gate electrode portion 107 formed in the trench 105 can be almost flat after etching back. Specifically, the thickness of the polysilicon layer is preferably larger than the width of the opening of the trench 105, and approximately 600 nm in this embodiment.

Then, the polysilicon layer is etched back by RIE to expose the gate insulation film 106 on the surface of the epitaxial layer 102 and to reach the depth for forming the interlayer insulation film 108 inside the trench 105 later. The polysilicon layer is thereby selectively left only inside the trench 105. Thus, the gate electrode portion 107 is formed inside the trench 105 as shown in FIG. 3A. Now, in the peripheral area of the semiconductor substrate (chip), the polysilicon layer to lead from the trench 105 to the surface of the semiconductor substrate is not etched in order to be electrically connected to a gate terminal, though not shown.

Then, as shown in FIG. 3B, the gate insulation film 106 on the surface of the epitaxial layer 102 is removed by wet etching to expose the surface of the epitaxial layer 102. At the same time, the gate insulation film 106 formed on the side wall of the trench 105 is removed to reach the vicinity of the surface of the polysilicon layer formed in the trench 105. However, this process may be omitted as described hereinafter.

Next, as shown in FIG. 3C, the thermally-oxidized film 108a is formed on the surfaces of the epitaxial layer 102 and the gate electrode portion 107. The thermally-oxidized film 108a is formed by oxidizing the surfaces of the epitaxial layer 102 and the gate electrode portion 107 in an atmosphere of $H_2$—$O_2$, for example. The gate electrode portion 107 is oxidized at high speed since polysilicon composing the gate electrode portion 107 has such a high density of impurities as dose amount of from $1\times10^{20}/cm^2$ to $1\times10^{22}/cm^2$. Therefore, the thermally-oxidized polysilicon film formed on the gate electrode portion 107 is from 2 to 4 times as thick as the thermally-oxidized film of the epitaxial layer 102 formed on the side wall of the trench 105. Specifically, the thermally-oxidized film of about 10 nm thickness is formed on the side wall of the trench 105 and the thermally-oxidized film of about 40 nm thickness is formed on the gate electrode portion 107. The both of thermally-oxidized films are integrally formed to be the thermally-oxidized film 108a.

Then, as shown in FIG. 3D, the silicate glass film 108b comprising one of NSG, BPSG and the like is deposited on whole surface of the thermally-oxidized film 108a. The deposited silicate glass film 108b has a thickness such that the silicate glass fills the entire inside of the trench 105 and the surface of the silicate glass film 108b becomes nearly flat. Therefore, the surface of the silicate glass film 108b can be united with the surface of the epitaxial layer 102 and the united surface can be almost flat after etching back. Specifically, the thickness of the deposited silicate glass film 108b is approximately 600 nm in this embodiment.

After that, as shown in FIG. 3E, the thermally-oxidized film 108a and the silicate glass film 108b are etched back to expose the surface of the epitaxial layer 102. Thus, the silicate glass film 108b of about from 80 to 300 nm thickness and the thermally-oxidized film 108a of about 40 nm thickness are thereby selectively left only inside the trench 105. The thickness of the silicate glass film 108b is easy to fluctuate by etching back. The silicate glass film 108b is formed to reach the vicinity of the top of the trench 105. Ideally, it is preferred that the surface of the silicate glass film 108b and the surface of the epitaxial layer 102 are integrated and the integrated surface is perfectly flat. However, as shown in FIG. 3E, since it is required that the insulation film on the surface of the epitaxial layer 102 is perfectly removed, the surface of the silicate glass film 108b is more concave than the surface of the epitaxial layer 102 in practice.

Next, as shown in FIG. 3F, an HTO (High Temperature Oxide) film 113 of about from 10 to 30 nm thickness is deposited by high temperature CVD on whole surface of the epitaxial layer 102. The HTO film 113 prevents the semiconductor substrate from being damaged in the next ion-implantation process. Instead of the HTO film, a thermally-oxidized film with the equivalent thickness may be used.

Then, as shown in FIG. 3G, ion implantation of P-type impurities such as boron (B) and heat treatment are successively carried out on the epitaxial layer 102. The conditions of the ion implantation using boron are: dose amount of from $5\times10^{12}$ to $2\times10^{13}/cm^{-2}$ and accelerating voltage of from 50 to 150 keV, for example. The heat treatment is performed for from 30 to 120 minutes in $N_2$ atmosphere at the temperature of from 950 to 1050° C., for example. In this process, a P-type diffusion layer corresponding to the body region 103 is formed above the epitaxial layer 102.

Further, ion implantation of N-type impurities such as arsenic (As) and heat treatment are successively carried out on the body region 103. The conditions of the ion implantation using arsenic are: dose amount of from $1 \times 10^{15}$ to $1 \times 10^{16}/\text{cm}^2$ and accelerating voltage of from 30 to 70 keV, for example. The heat treatment is performed for from 10 to 60 minutes in $N_2$ atmosphere at the temperature of from 900 to 1000° C., for example. By this process, the surface region of the body region 103 becomes N-type. This $N^+$-type diffusion layer corresponding to the source region 104 is thereby formed on the surface of the body region 103. In the process of the ion implantation for forming the source region 104, a photoresist mask (not shown) is formed on the area for forming the body contact region 111 shown in FIG. 2 and the source region 104 is formed in the planar arrangement shown FIG. 2. Then, the source region 104 is masked, ion implantation of P-type impurities such as boron (B) into the body region 103 is carried out, and the heat treatment is performed. Thus, the $P^+$-type diffusion layer corresponding to the body contact region 111 is formed, though not shown.

After the process shown in FIG. 3G, the HTO film 113 is removed by etching. It is required that the HTO film 113 on the source region 104 is completely removed, but in the trench 105, the HTO film 113 may remain as a part of the interlayer insulation film 108.

Finally, a film of barrier metal such as Ti and/or TiN is formed by sputtering on whole surface of the source region 104 and the interlayer insulation film 108, though not shown. Next, the source electrode 110 comprising one of Al and Cu, for example, is formed on the barrier metal film by sputtering. Further, the drain electrode 111 with a multilayer structure comprising one of Ti, Cr, Ni, Au, Ag and the like is formed by sputtering on whole surface of the other surface of the $N^+$-type semiconductor substrate 101. As mentioned above, the semiconductor apparatus 100 shown in FIG. 1 is manufactured.

The process for removing the gate insulation film 106 shown in FIG. 3B may be omitted. The manufacturing process in this case is illustrated in FIGS. 4A to 4F. FIG. 4A is the same as FIG. 3A. FIG. 4B is corresponding to FIG. 3C. While the gate insulation film 106 on the surface of the epitaxial layer 102 and on the side wall of the trench 105 is removed in FIG. 3C, the gate insulation film 106 of this part remains in FIG. 4B. Each of the drawings from FIG. 4C to FIG. 4F is corresponding to each of the drawings from FIG. 3D to FIG. 3G and both basically have the same process. However, the gate insulation film 106 on the surface of the epitaxial layer 102 is removed as well as the silicate glass film 108b in the process shown in FIG. 4D. In this case, as shown in FIG. 4F, the gate insulation film 106 on the side wall of the trench 105 remains eventually.

In this embodiment, as mentioned above, after the interlayer insulation film 108 with at least two layers is formed to the top of trench 105 on the gate electrode portion 107 formed in the trench 105, the body region 103 and the source region 104 are formed by ion implantation. Thus, ions are not implanted from the side wall of the trench 105 in the ion implantation process. Additionally, the thick thermally-oxidized film 108a on each gate electrode portion 107 that has a high breakdown voltage performance is formed before forming the body region 103 and the source region 104, heat treatment for forming the thermally-oxidized film 108a has no effect on the body region 103 and the source region 104. Also, heat treatment for forming the interlayer insulation film 108 has no effect on the body region 103 and the source region 104. Therefore, the impurity concentration of the body region 103 and the source region 104 after heat treatment are nearly constant all over the semiconductor substrate. Specifically, there is not so much difference in the impurity concentration between in the area near the trench 105 and in the other area. Thus, the shape of the interface between the epitaxial layer 102 and the body region 103 and the shape of the interface between the body region 103 and the source region 104 are almost flat and parallel to the surface of the semiconductor substrate all over the semiconductor substrate. Further, the shape of the body region 103 and the source region 104 is not changed by later processes. Therefore, the channel length can easily be controlled, which makes it possible to realize shallow junction with the shorter channel length. Further, since the interlayer insulation film 108 has the thermally-oxidized film 108a and the silicate glass film 108b, it can be formed thinner, which leads to shallower source region 104. Therefore, lower ON-resistance can be obtained.

It is apparent that the present invention is not limited to the above embodiment but may be modified and changed without departing from the scope and spirit of the invention.

What is claimed is:

1. A method of manufacturing a semiconductor apparatus, comprising:
    forming a trench in a semiconductor layer;
    forming a gate electrode inside the trench;
    forming a thermally-oxidized film on the gate electrode inside the trench;
    forming a silicate glass film on the thermally-oxidized film inside the trench;
    forming a body region inside the semiconductor layer after forming the silicate glass film; and
    forming a source region on the body region.

2. The method of manufacturing a semiconductor apparatus according to claim 1, wherein the silicate glass film is formed by etching back to expose the surface of the semiconductor layer after covering the surface of the semiconductor layer and the inside of the trench by the silicate glass.

3. The method of manufacturing a semiconductor apparatus according to claim 1, wherein the thermally-oxidized film includes a thermally-oxidized film of polysilicon composing the gate electrode.

4. The method of manufacturing a semiconductor apparatus according to claim 3, wherein the thermally-oxidized film of polysilicon is thicker than a thermally-oxidized film of single crystal silicon formed on the side wall of the trench.

5. The method of manufacturing a semiconductor apparatus according to claim 1, wherein the silicate glass film comprises at least one of BPSG and NSG.

6. The method of manufacturing a semiconductor apparatus according to claim 1, wherein the source region is divided by a body contact region in the longitudinal direction of each area surrounded by the trench.

7. The method of manufacturing a semiconductor apparatus according to claim 1, wherein a source electrode is formed on a surface of the source region and the silicate glass film.

8. The method of manufacturing a semiconductor apparatus according to claim 1, wherein when the silicate glass film is formed inside the trench, the silicate glass film is formed on the semiconductor layer, then the silicate glass film is etched back to expose the semiconductor layer and leave the silicate glass film in the trench.

* * * * *